United States Patent
Lyons et al.

(10) Patent No.: US 6,183,938 B1
(45) Date of Patent: Feb. 6, 2001

(54) CONFORMAL ORGANIC COATINGS FOR SIDEWALL PATTERNING OF SUBLITHOGRAPHIC STRUCTURES

(75) Inventors: Christopher F. Lyons, Fremont; Michael K. Templeton, Atherton, both of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/207,551

(22) Filed: Dec. 8, 1998

(51) Int. Cl.$^7$ .................................................. G03F 7/00
(52) U.S. Cl. ............................................. 430/313; 430/317
(58) Field of Search ....................................... 430/313, 317

(56) References Cited

U.S. PATENT DOCUMENTS

| | | | |
|---|---|---|---|
| 5,595,941 | 1/1997 | Okamoto et al. | 437/228 |
| 5,705,321 | 1/1998 | Brueck et al. | 430/316 |
| 5,710,066 | 1/1998 | Okamoto et al. | 437/228 |
| 5,714,039 | 2/1998 | Beilstein, Jr. et al. | 156/657.1 |
| 5,827,634 | 10/1998 | Thackeray et al. | 430/270.1 |
| 5,847,218 | * 12/1998 | Ohsawa | 564/430 |
| 6,020,269 | * 2/2000 | Wang | 438/717 |

* cited by examiner

*Primary Examiner*—Mark F. Huff
*Assistant Examiner*—Nicole Barreca
(74) *Attorney, Agent, or Firm*—Renner, Otto, Boissells & Sklar, LLP

(57) ABSTRACT

In one embodiment, the present invention relates to a method of making a sub-lithographic structure involving the steps of providing a nitrogen rich film over a portion of a substrate; depositing a photoresist over the nitrogen rich film and the substrate, wherein the photoresist and the nitrogen rich film interact and form a thin desensitized resist layer around an interface between the photoresist and the nitrogen rich film; exposing the photoresist to radiation; developing the photoresist exposing the thin desensitized resist layer; directionally etching a portion of the thin desensitized resist layer; and removing the nitrogen rich film leaving the sub-lithographic structure on the substrate.

20 Claims, 1 Drawing Sheet

CONFORMAL ORGANIC COATINGS FOR SIDEWALL PATTERNING OF SUBLITHOGRAPHIC STRUCTURES

TECHNICAL FIELD

The present invention generally relates to using an organic coating to make very small features. In particular, the present invention relates to using an organic coating and a nitrogen rich material to make sub-lithographic structures.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m or less with acceptable resolution is difficult at best, and impossible in some circumstances. Procedures that increase resolution, improved critical dimension control, and provide small features are therefore desired.

SUMMARY OF THE INVENTION

The present invention provides methods of forming sub-lithographic features. The present invention also provides sub-lithographic features that are particularly useful for subsequent lithographic procedures.

In one embodiment, the present invention relates to a method of making a sub-lithographic structure involving the steps of providing a nitrogen rich film over a portion of a substrate; depositing a photoresist over the nitrogen rich film and the substrate, wherein the photoresist and the nitrogen rich film interact and form a thin desensitized resist layer around an interface between the photoresist and the nitrogen rich film; exposing the photoresist to radiation; developing the photoresist exposing the thin desensitized resist layer; directionally etching a portion of the thin desensitized resist layer; and removing the nitrogen rich film leaving the sub-lithographic structure on the substrate.

In another embodiment, the present invention relates to a method of making a sub-lithographic structure involving the steps of providing a nitrogen rich film over a portion of a substrate, the nitrogen rich film including at least one edge; depositing an acid catalyzed photoresist over the nitrogen rich film and the substrate, wherein the acid catalyzed photoresist and the nitrogen rich film interact and form a thin desensitized resist layer around an interface between the acid catalyzed photoresist and the nitrogen rich film; exposing the acid catalyzed photoresist to radiation; developing the acid catalyzed photoresist exposing the thin desensitized resist layer; directionally etching a portion of the thin desensitized resist layer formed above the nitrogen rich film while maintaining a portion of the thin desensitized resist layer laterally adjacent at least one edge of the nitrogen rich film; and removing the nitrogen rich film leaving the portion of the thin desensitized resist layer laterally adjacent at least one edge of the nitrogen rich film forming the sub-lithographic structure on the substrate, wherein the sub-lithographic structure has a width from about 100 Å to about 2,000 Å and a height from about 300 Å to about 5,000 Å.

In yet another embodiment, the present invention relates to a method of processing a semiconductor substrate, involving the steps of providing a silicon nitride film over a portion of a substrate; depositing an acid catalyzed photoresist over the silicon nitride film and the substrate, wherein the acid catalyzed photoresist and the silicon nitride film interact and form a thin desensitized resist layer having a thickness from about 100 Å to about 2,000 Å around an interface between the acid catalyzed photoresist and the silicon nitride film; exposing the acid catalyzed photoresist to radiation; developing the acid catalyzed photoresist with an aqueous alkaline solution exposing the thin desensitized resist layer; directionally etching a portion of the thin desensitized resist layer; and removing the silicon nitride film leaving a sub-lithographic structure on the substrate.

DISCLOSURE OF INVENTION

Figure 1:
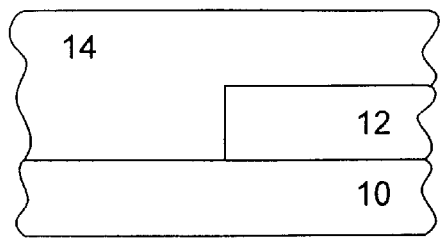
FIG. 1 illustrates a cross-sectional view of a method according to one aspect of the present invention.

The present invention involves making sub-lithographic structures by sidewall patterning of organic coatings. The present invention more specifically involves methods of forming patterning sub-lithographic features in an efficient manner.

Initially, a nitrogen rich film is provided over a substrate. The substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The nitrogen rich film is provided over a portion of the substrate or over all of the substrate and etched back so that the nitrogen rich film has at least one sidewall substantially perpendicular to the substrate surface. In most embodiments, the nitrogen rich film has two or more sidewalls substantially perpendicular to the substrate surface.

The nitrogen rich film is a layer containing a substantial amount of nitrogen. Examples of nitrogen rich films include nitride films such as silicon nitride, nitride rich silicon oxynitride, titanium nitride, tantalum nitride, and tungsten nitride. The nitrogen rich film is formed in any suitable manner, including CVD techniques. CVD techniques include low pressure chemical vapor deposition (LPCVD) and plasma enhanced chemical vapor deposition (PECVD). For example, a silicon nitride film may be made by PECVD or LPCVD employing gases containing silicon and nitrogen, such as using $SiH_4$ or $SiCl_2H_2$ and $N_2$ or $NH_3$. In one embodiment, the nitrogen rich film is a silicon nitride layer made by LPCVD techniques employing $SiCl_2H_2$ and $NH_3$. In another embodiment, the nitrogen rich film is a silicon nitride layer made by PECVD techniques employing $SiH_4$ and $NH_3$.

The thickness of the nitrogen rich film varies depending upon the desired height of the resultant thin desensitized layer, but is not critical to the present invention. In one embodiment, the nitrogen rich film has a thickness from about 1,000 Å to about 5,000 Å. In another embodiment, the nitrogen rich film has a thickness from about 1,500 Å to about 4,000 Å. In yet another embodiment, the nitrogen rich film has a thickness from about 2,000 Å to about 3,500 Å.

A photoresist is deposited over the nitrogen rich film. The photoresist contains an acid catalyzed resin material. The acid catalyzed resin material undergoes a chemical change upon exposure to actinic radiation. Particularly, an acid catalyzed resin material contains a photoacid generator that generates an acid upon exposure to activating radiation. Photoacid generating compounds include aromatic substituted halohydrocarbons (such as 1,1-bis(p-chlorophenyl)-2, 2,2-trichloroethane), halo-substituted sulfur containing compounds, haloheterocyclic compounds, onium salts (such as diaryl diazonium salts), sulfonated esters, and sulfonated ketones. In one embodiment, the acid catalyzed resin material is a chemically amplified photoresist.

Any suitable wavelength of radiation may be employed to expose the photoresist so long as an acid catalyzed resin material is used. For example, radiation having wavelengths from about 1 nm to about 500 nm may be employed. Acid catalyzed resin photoresists may include a 157 nm sensitive photoresist, a 193 nm sensitive photoresist, an I-line, H-line, G-line, E-line, mid UV, deep UV or an extreme UV photoresist material. Deep UV photoresists are preferred. Photoresists are commercially available from a number of sources, including Shipley Company, Kodak, Hoechst Celanese Corporation, Brewer and IBM. A specific example of a deep UV photoresist is a combination of a partially t-butoxycarbonyloxy substituted poly-p-hydroxystyrene and a photoacid generator.

The photoresist may be deposited using any suitable means on the nitrogen rich film. For example, the photoresist may be spin-coated on the nitrogen rich film. The photoresist is applied to any suitable thickess as the thickness is not critical to the invention. In one embodiment, the photoresist is applied to a thickness from about 200 Å to about 10,000 Å. In another embodiment, the photoresist is applied to a thickness from about 1,000 Å to about 5,000 Å.

While the photoresist is in contact with the nitrogen rich film, a chemical interaction takes place within the portions of the photoresist adjacent the nitrogen rich film forming a thin desensitized resist layer within the photoresist. Although not wishing to be bound by any theory, it is believed that nitrogen atoms from the nitrogen rich film poison a thin portion of the photoresist adjacent the nitrogen rich film. More particularly, it is believed that nitrogen atoms at the interface of the nitrogen rich film and the photoresist act as a Lewis base neutralizing the photogenerated acid preventing chemical change (acid catalysis) following exposure to actinic radiation. Thus, a thin desensitized resist layer is formed within the photoresist which is identifiable after the remaining portions of the photoresist are removed or developed.

The thickness of the thin desensitized resist layer formed within the photoresist is from about 100 Å to about 2,000 Å. In another embodiment, the thickness of the thin desensitized resist layer formed within the photoresist is from about 200 Å to about 1,500 Å. In yet another embodiment, the thickness of the thin desensitized resist layer formed within the photoresist is from about 300 Å to about 1,000 Å. The time which the nitrogen rich film is permitted to poison the photoresist is not critical because the poisoning typically does not extend beyond about 2,000 Å into the photoresist. Nevertheless, in an exemplary process the photoresist and nitrogen rich film are in contact for a time period from about 10 seconds to about 3 hours, although slightly shorter or longer times may be permitted.

The photoresist is flood or blanket exposed (the entire photoresist coated substrate is exposed without a mask) to suitable actinic radiation, and the photoresist is developed with a developer removing the unpoisoned portions of the photoresist leaving a thin desensitized resist layer adjacent the nitrogen rich film. Any developer may be used to remove the exposed and unpoisoned portions of the photoresist including aqueous alkaline developers. Aqueous alkaline developers typically contain a hydroxide compound, such as tetramethylammonium hydroxide. The thin desensitized resist layer is then optionally rinsed or cleaned. The thickness of the thin desensitized resist layer after development remains from about 100 Å to about 2,000 Å. In one embodiment, the thickness of the thin desensitized resist layer is substantially uniform around the nitrogen rich film in that the thickness does not vary by more than about 50 Å comparing the thickest and thinnest areas.

For purposes of this invention, there are two main portions of the thin desensitized resist layer. The first is a portion of the thin desensitized resist layer is adjacent the sidewall(s) of the nitrogen rich film and is referred to as the vertical portion herein. The height of the first portion substantially corresponds to the sum of the thickness of the nitrogen rich film and the thickness of the thin desensitized resist layer. The second is a portion of the thin desensitized resist layer covers the top surface of the nitrogen rich film and is referred to as the horizontal portion herein. The height of the second portion substantially corresponds to the thickness of the thin desensitized resist layer.

A directional etch is performed to remove portions of the thin desensitized resist layer covering the top surface of the nitrogen rich film (the second portion as defined above). In a preferred embodiment, a dry anisotropic etch process is employed whereby the horizontal portion of the thin desensitized resist layer is removed. In one embodiment, an RIE technique is employed. Typically, an oxidizing plasma is employed to remove a portion of the thin desensitized resist layer. Oxidizing plasmas include oxygen or sulfur containing gases, such s $O_2$. The etch technique is selected so that the nitrogen rich film is not etched or degraded. In this connection, the nitrogen rich film acts as an etch stop layer when performing a directional etch of the thin desensitized resist layer.

While the directional etch removes the horizontal portions of the thin desensitized resist layer, a small amount of the vertical portion of the thin desensitized resist layer is also removed. However, in most instances, the small amount of the vertical portion removed substantially corresponds with the thickness of the thin desensitized resist layer thus leaving a vertical portion of the thin desensitized resist layer (having a height) equal to or slightly less than the thickness of the nitrogen rich film. Typically, the height of the vertical portion of the thin desensitized resist layer is slightly less than (from about 1% to about 20% less based upon the thickness of the nitrogen rich film) the thickness of the nitrogen rich film. All or substantially all (from about 80% to about 99% of the original height) of the vertical portion of the thin desensitized resist layer remains positioned adjacent the sidewall of the nitrogen rich film.

After directional etch of the horizontal portions of the thin desensitized resist layer, the nitrogen rich film is removed in a manner so as not to damage or substantially remove the remaining vertical portion of the thin desensitized resist layer. In one embodiment, the nitrogen rich film is removed or etched using an anisotropic etching process. Dry or wet etching techniques may be employed. In a preferred embodiment, dry etch techniques are used. Dry etch techniques involve using fluorine compounds, such as one of $NF_3$, $SF_6$, $CH_3F$, $CF_4$ and $CHF_3$. In a preferred embodiment, reactive ion etching (RIE) is employed. Remaining on the substrate is one or more lines (depending upon the shape of the patterning of the nitrogen rich film) of vertical thin desensitized resist layer constituting a sub-lithographic structure or feature. The dimensions of the resulting sub-lithographic feature depend primarily upon the specific identity of the photoresist, the identity of the nitrogen rich film, the thickess of the nitrogen rich film and the extent of the directional etch performed on the thin desensitized resist layer. The dimensions of the resulting sub-lithographic feature may be from about 100 Å to about 2,000 Å in width and from about 300 Å to about 5,000 Å in height. In another embodiment, the dimensions of the resulting sub-lithographic feature may be from about 200 Å to about 1,500 Å in width and from about 500 Å to about 4,000 Å in height. In yet another embodiment, the dimensions of the resulting sub-lithographic feature may be from about 300 Å to about 1,000 Å in width and from about 1,000 Å to about 3,000 Å in height.

The resulting sub-lithographic feature made in accordance with the present invention may be useful for subsequent processing of the substrate on which it is positioned. For example, the sub-lithographic feature made in accordance with the present invention may be used for forming narrow features using one of photolithography techniques (pattern transfer to underlying layer), etching techniques, or deposition techniques. In particular, the sub-lithographic feature made in accordance with the present invention may be used as a mask during photolithography techniques, etching techniques, or deposition techniques.

One specific embodiment of the methods of the present invention is now described in connection with Figures. Referring to FIG. 1, a substrate 10 is provided with a nitrogen rich film 12 over a portion of the substrate 10. Although not shown, substrate 10 may include any suitable semiconductor material (one or more layers of semiconductor materials), for example, a monocrystalline silicon substrate. Also, although not shown, substrate 10 may include of one or more layers including substrate layers, diffusion regions, dielectric layers such as oxides, devices, polysilicon layers, and the like.

The nitrogen rich film may be deposited over the entire substrate 10 and patterned to cover a desired portion of the substrate 10 using, for instance, photolithography and etching techniques. In this embodiment, the nitrogen rich film 12 comprises silicon nitride made by CVD techniques using $SiH_4$ and $NH_3$. The thickness of the nitrogen rich film 12 is about 2,000 Å. A photoresist 14 is deposited over the substrate 10 partially covered with the nitrogen rich film 12. In this embodiment, the photoresist 14 comprises an acid catalyzed deep UV photoresist.

Figure 2:
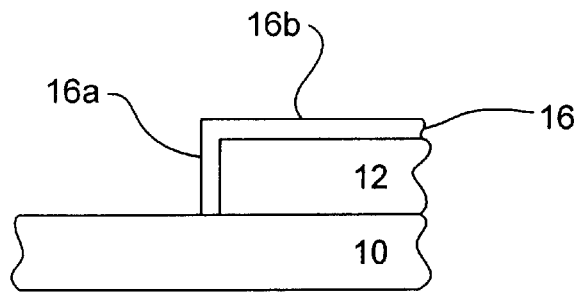
FIG. 2 illustrates a cross-sectional view of a method according to one aspect of the present invention.

Referring to FIG. 2, the entire surface photoresist 14 is exposed (flood or blanket exposure) to radiation and developed with a suitable developer resulting in a thin desensitized resist layer 16 formed around the nitrogen rich film 12. In this embodiment, the radiation has a wavelength of 248 nm. In this embodiment, the thickness of the thin desensitized resist layer 16 is about 250 Å. The thickness of the thin desensitized resist layer 16 is substantially uniform around the nitrogen rich film 12. There are two portions of the thin desensitized resist layer 16; namely, a portion 16a adjacent the sidewall(s) of the nitrogen rich film 12 and a portion 16b covering the top surface of the nitrogen rich film 12.

Figure 3:
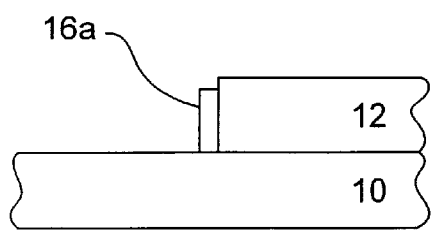
FIG. 3 illustrates a cross-sectional view of a method according to one aspect of the present invention.

Referring to FIG. 3, a directional etch is performed removing portions of the thin desensitized resist layer 16 covering the nitrogen rich film 12. In this embodiment, an anisotropic dry etch using $O_2$ is performed for a time sufficient to remove the portions 16b of the thin desensitized resist layer 16 over the top surface of the nitrogen rich film 12, but not so long as to remove portions 16a of the thin desensitized resist layer 16 adjacent the sidewall(s) of the nitrogen rich film 12. In most instances, the height of remaining portion 16a of the thin desensitized resist layer 16 is slightly less than the thickness of the nitrogen rich film 12.

Figure 4:
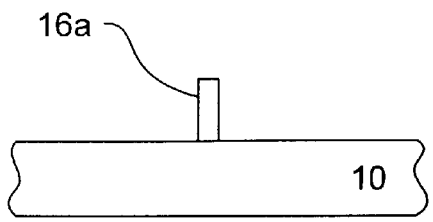
FIG. 4 illustrates a cross-sectional view of a method according to one aspect of the present invention.

Referring to FIG. 4, the nitrogen rich film 12 is removed by suitable means. For example, a selective etch technique is used to remove the nitrogen rich film 12 from substrate 10 leaving patterned remaining portion 16a of the thin desensitized resist layer 16. In this embodiment, a dry etch technique including a fluorocarbon, such as $CHF_3$, is employed. The etch technique has selectivity in that the size of the remaining portion 16a of the thin desensitized resist layer 16 is not substantially reduced.

In this embodiment, the height and width of patterned remaining portion 16a of the thin desensitized resist layer 16 is about 1,700 Å and about 250 Å. The patterned remaining portion 16a of the thin desensitized resist layer 16 may be used in further photolithography processing, such as for transferring a pattern to an underlying layer in substrate 10 (acting as etch mask pattern). The patterned remaining portion 16a of the thin desensitized resist layer 16 is particularly useful for forming narrow features using one of photolithography techniques, etching techniques, or deposition techniques.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a sub-lithographic structure comprising:
   providing a nitrogen rich film over a portion of a substrate;
   depositing a photoresist over the nitrogen rich film and the substrate, wherein the photoresist and the nitrogen rich film interact and form a thin desensitized resist layer around an interface between the photoresist and the nitrogen rich film, wherein the thin desensitized resist layer comprises a first, vertical portion and a second, horizontal portion;
   exposing the photoresist to radiation;
   developing the photoresist exposing the thin desensitized resist layer;
   directionally etching the second portion of the thin desensitized resist layer, leaving the first portion of the thin desensitized resist layer, thereby forming the sub-lithographic structure; and
   removing the nitrogen rich film leaving the sub-lithographic structure on the substrate.

2. The method of claim 1, wherein the nitrogen rich film comprises at least one of silicon nitride, nitride rich silicon oxynitride, titanium nitride, tantalum nitride, and tungsten nitride.

3. The method of claim 1, wherein the nitrogen rich film has a thickness from about 1,000 Å to about 5,000 Å.

4. The method of claim 1, wherein the photoresist comprises an acid catalyzed photoresist.

5. The method of claim 1, wherein the photoresist comprises a deep ultraviolet photoresist.

6. The method of claim 1, wherein the thin desensitized resist layer has a thickness from about 100 Å to about 2,000 Å.

7. The method of claim 1, wherein the sub-lithographic structure has a width from about 100 Å to about 2,000 Å and a height from about 300 Å to about 5,000 Å.

8. A method of making a sub-lithographic structure comprising:
   providing a nitrogen rich film over a portion of a substrate, the nitrogen rich film including at least one edge;
   depositing an acid catalyzed photoresist over the nitrogen rich film and the substrate, wherein the acid catalyzed photoresist and the nitrogen rich film interact and form a thin desensitized resist layer around an interface between the acid catalyzed photoresist and the nitrogen rich film;
   exposing the acid catalyzed photoresist to radiation;
   developing the acid catalyzed photoresist exposing the thin desensitized resist layer;
   directionally etching a portion of the thin desensitized resist layer formed above the nitrogen rich film while maintaining a portion of the thin desensitized resist layer laterally adjacent at least one edge; and
   removing the nitrogen rich film leaving the portion of the thin desensitized resist layer laterally adjacent at least one edge of the nitrogen rich film forming the sub-lithographic structure on the substrate, wherein the sub-lithographic structure has a width from about 100 Å to about 2,000 Å and a height from about 300 Å to about 5,000 Å.

9. The method of claim 8, wherein the nitrogen rich film has a thickness from about 1,500 Å to about 4,000 Å.

10. The method of claim 8, wherein the nitrogen rich film comprises silicon nitride.

11. The method of claim 10, wherein the silicon nitride is made by chemical vapor deposition using $NH_3$ and $SiH_4$.

12. The method of claim 8, wherein the acid catalyzed photoresist is flood exposed to radiation having a wavelength from about 1 nm to about 500 nm.

13. The method of claim 8, wherein the thin desensitized resist layer is etched using an anisotropic reactive ion etching technique.

14. The method of claim 8, wherein the nitrogen rich film is removed using an anisotropic reactive ion etching technique.

15. A method of processing a semiconductor substrate, comprising:
   providing a silicon nitride film over a portion of a substrate;
   depositing an acid catalyzed photoresist over the silicon nitride film and the substrate, wherein the acid catalyzed photoresist and the silicon nitride film interact and form a thin desensitized resist layer having a thickness from about 100 Å to about 2,000 Å around an interface between the acid catalyzed photoresist and the silicon nitride film, wherein the thin desensitized resist layer comprises a first, vertical portion and a second, horizontal portion;
   exposing the acid catalyzed photoresist to radiation;
   developing the acid catalyzed photoresist with an aqueous alkaline solution exposing the thin desensitized resist layer;
   directionally etching the second portion of the thin desensitized resist layer, leaving the first portion of the thin desensitized resist layer, thereby forming the sub-lithographic structure; and
   removing the silicon nitride film leaving a sub-lithographic structure on the substrate.

16. The method of claim 15, wherein the silicon nitride film has a thickness from about 1,000 Å to about 5,000 Å.

17. The method of claim 15, wherein the acid catalyzed photoresist comprises a deep ultraviolet photoresist.

18. The method of claim 15, wherein the thin desensitized resist layer has a thickness from about 300 Å to about 1,000 Å.

19. The method of claim 15, wherein the silicon nitride film is removed using an anisotropic reactive ion etching technique involving a fluorine compound.

20. The method of claim 15, wherein the sub-lithographic structure has a width from about 200 Å to about 1,500 Å and a height from about 500 Å to about 4,000 Å.

* * * * *

UNITED STATES PATENT AND TRADEMARK OFFICE
CERTIFICATE OF CORRECTION

PATENT NO. : 6,183,938 B1
DATED : February 6, 2001
INVENTOR(S) : Christopher F. Lyons and Michael K. Templeton It is certified that error appears in the above-identified patent and that said Letters Patent is hereby corrected as shown below:

Column 4,
Line 66, replace "gases, such s $O_2$." with -- gases, such as $O_2$. --

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*